US006319316B1

(12) United States Patent
Gibson et al.

(10) Patent No.: US 6,319,316 B1
(45) Date of Patent: Nov. 20, 2001

(54) SYSTEM AND METHOD FOR PERFORMING LOW CONTAMINATION EXTRUSION FOR MICROELECTRONICS APPLICATIONS

(75) Inventors: Gregory M. Gibson; Rene Soliz; C. Matthew Ramon, all of Dallas, TX (US)

(73) Assignee: Fastar, Ltd., Dallas, TX (US)

( * ) Notice: Subject to any disclaimer, the term of this patent is extended or adjusted under 35 U.S.C. 154(b) by 0 days.

(21) Appl. No.: 09/251,646

(22) Filed: Feb. 17, 1999

Related U.S. Application Data
(60) Provisional application No. 60/074,972, filed on Feb. 17, 1998, and provisional application No. 60/074,971, filed on Feb. 17, 1998.

(51) Int. Cl.[7] ............................................. B05C 5/00
(52) U.S. Cl. ................................... 118/50; 118/410
(58) Field of Search ................................ 118/400, 407, 118/410, 411, 50

(56) References Cited

U.S. PATENT DOCUMENTS

| 4,934,309 | * | 6/1990 | Ledermann et al. | 118/50 |
| 5,002,008 | * | 3/1991 | Ushijima et al. | 118/313 |
| 5,073,394 | * | 12/1991 | Dake et al. | 426/509 |
| 5,183,508 | * | 2/1993 | Cholinski | 118/683 |
| 5,824,156 | * | 10/1998 | Watanabe et al. | 118/410 |

* cited by examiner

Primary Examiner—James Sells
(74) Attorney, Agent, or Firm—Winstead Sechrest & Minick P.C.

(57) ABSTRACT

This invention relates to a system and method for performing accurate coating operations while minimizing contamination of the coating fluid arising from contact between the fluid and the extrusion head. In one embodiment, the extrusion head is composed entirely of non-metallic material, possibly ceramic, thereby minimizing any material removal by the fluid, and any ionic or chemical reaction between the extrusion head material and the fluid. In another embodiment, a shim separating metal parts of an extrusion head is composed of a non-metallic substance to prevent galvanic potential induced corrosion between the shim and the extrusion head material and the resulting release of the products of such corrosion into the coating fluid.

22 Claims, 8 Drawing Sheets

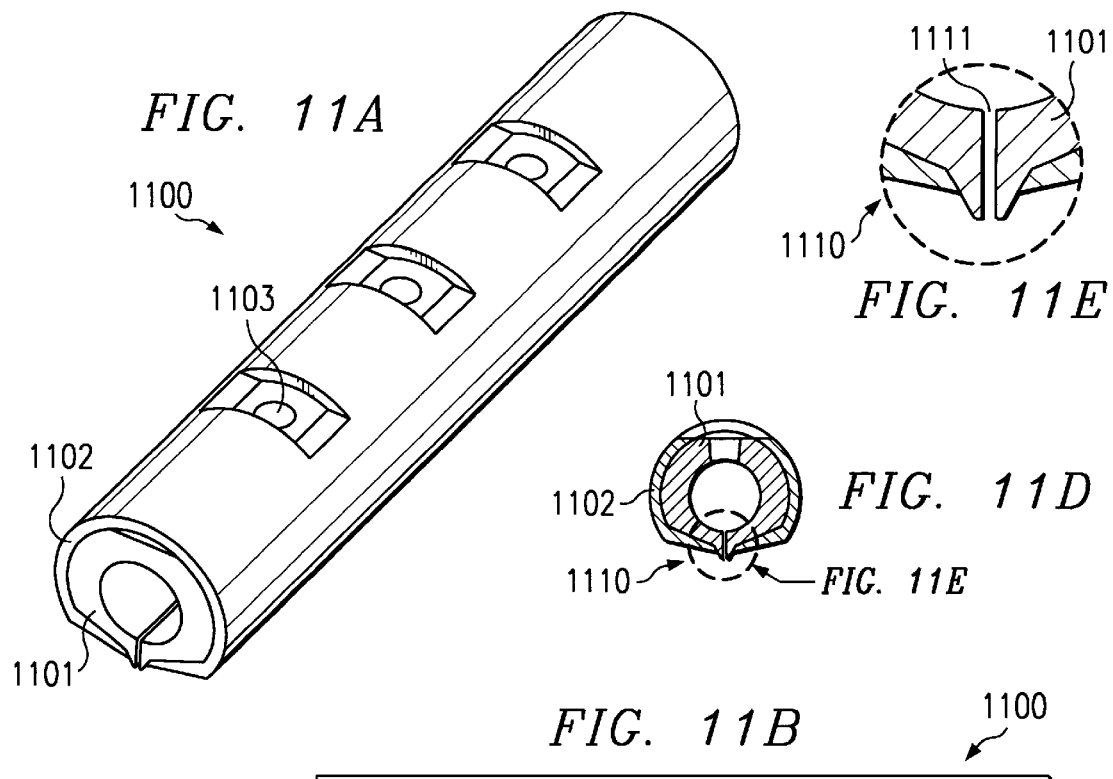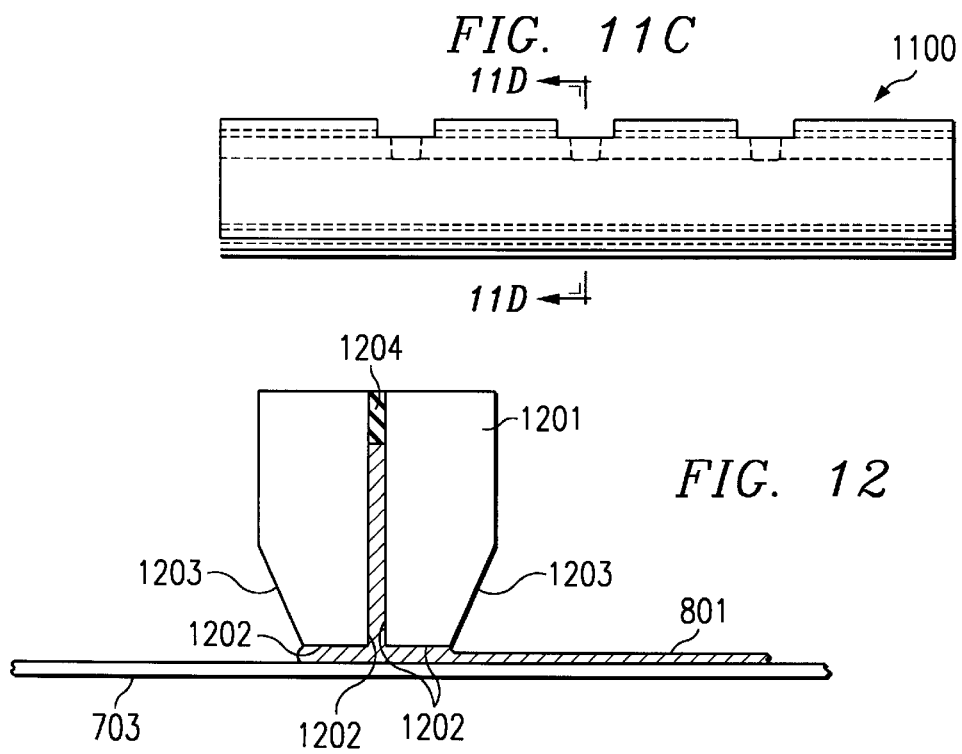

SYSTEM AND METHOD FOR PERFORMING LOW CONTAMINATION EXTRUSION FOR MICROELECTRONICS APPLICATIONS

RELATED APPLICATIONS

This application claims the benefit of U.S. Provisional Application Serial No. 60/074,972 filed Feb. $17^{th}$, 1998, entitled "NON-CONTAMINATING EXTRUSION DIE FOR MICROELECTRONICS APPLICATIONS",and Provisional Application Serial No. 60/074,971 filed Feb. $17^{th}$, 1998, entitled "NON-CONTAMINATING EXTRUSION HEAD SHIM", the disclosures of which are incorporated herein by reference.

The present application is also related, and reference hereby made, to previously filed, co-pending, and commonly assigned patent applications: Ser. No. [09/148,463] entitled "LINEAR EXTRUSION COATING SYSTEM AND METHOD"; and Ser. No. [09/227,667] entitled "MOVING HEAD, COATING APPARATUS AND METHOD".

TECHNICAL FIELD

This invention relates in general to systems and methods for extrusion and in particular to extruding in a non-contaminating manner over parts intended for use in microelectronics applications.

BACKGROUND

It is often necessary or desired to provide a coating of a particular substrate. For example, in the micro-electronics industry it is often desired to coat a substrate used in the manufacture of integrated circuits for further processing. Often it is required that such coatings be applied in a very thin coat, such as a thin coat of photoresist used in masking and etching a silicon substrate for manufacturing integrated circuits, which is uniform across the entire surface of the substrate. However, as the coating is so thin, very minute variances in its thickness may not be acceptable.

Accordingly, the prior art has relied upon various methods for providing a continuous, uniform, thin coating of a substrate. However, in the past these methods have been inefficient and, therefore, prone to waste.

For example, a commonly relied upon prior art method of coating a substrate is spin coating. Here a coating material, typically suspended in a solvent based fluid, is deposited in a pool on the substrate to be coated, generally at or near the center of the surface to be coated. Thereafter, the substrate itself is rotated at a high speed about an axis normal to the surface to be coated. Centrifugal forces created by the rotation of the substrate cause the pool of material to migrate toward the edges of the substrate. Accordingly, rotating the substrate for a sufficient length of time at a proper speed will result in a substantially uniform coating having a desired thickness, where a sufficiently ductile coating material is present.

However, the spin method of coating the substrate necessarily results in an amount of coating material being expelled from the surface to be coated. In practice, the expelled portion of coating material may be as great as 90–95% of the material initially deposited in the pool on the substrate. Typically this material which is expelled from the surface is lost as there are often very stringent purity requirements and/or the solvents suspending the material being quick to evaporate making their recycling difficult or impossible. Moreover, spin coating is generally not completely effective in evenly distributing a very viscous coating material.

These coating materials are generally very expensive and therefore the waste that occurs in coating the substrate can be an important consideration. Accordingly, although providing a reliable method for achieving a uniform coating of a substrate, the prior art spin methods introduce an undesired level of waste. Moreover, the amount of waste increases as the size of the substrate increases causing such inefficiencies to be increasingly unpalatable as the industry moves to larger and larger substrates, e.g., 3.5 generation LCD technology and 12 inch silicon wafers and still larger flat panel displays (FPDs).

It should also be appreciated that the excess material discharged from the above mentioned spin technique presents, at a minimum, a requirement for the subsequent handling and cleanup of this substantial amount of unused material. Because of material purity requirements, this discharged material must often be disposed of However, often this material, and/or its solvent carrier, are hazardous materials, and must therefore be handled with extreme care as well as being disposed of in accordance with stringent guidelines. Likewise, often the solvents utilized in cleanup of such discharged material are hazardous, thus compelling their restricted use.

Additionally, the prior art spin methods of coating the substrate can result in the outer edges and/or the back surface of the substrate also being coated by the material. This can be undesired as subsequent handling of the substrate, having its edges coated, may result in the chipping and peeling of the coating on these edges which effects may propagate onto the surface for which a uniform coating is desired. Moreover, coating of the back edges and/or back surface may also result in the contamination of the surface desired to be coated.

Furthermore, the solvents carrying the desired coating materials in suspension may be highly unstable and, therefore, prone to rapid dissipation, such as through evaporation. Accordingly, uneven coating may result in the aforementioned spin technique where, for example, an appreciable time between depositing the pool of material for spinning, or where the substrate surface to be coated is large.

In spite of the disadvantages of the spin coating method, it has been employed when coating silicon wafers, flat panel displays, and any surfaces which are particularly sensitive to the presence of contaminants. The spin coating equipment, and in particular, the fluid handling surfaces of the spin coating equipment can be constructed out of non-metallic material thereby reducing contamination of the coating fluid arising from contact between the coating fluid and metal surfaces. Spin coating for such surfaces has therefore been acceptable in spite of the disadvantages of the method listed above.

In a typical prior art embodiment, a TEFLON# (available from E.I. DuPont De Nemours and Company) or other non-metallic tube dispenses coating material onto a substrate being spun or otherwise moved underneath the tube. Such an embodiment does not require delicate machining or that precise tolerances be maintained, thereby permitting the production of non-metallic spin coating fluid dispensing to be accomplished in a straightforward manner.

Extrusion dies may be used for the application of layers of liquid polymers to various surfaces or substrates as shown and described in the incorporated patent application Ser. No. 09/148,463. The liquid polymer is typically dispensed through the extrusion die at a precise rate as the die is moved relative to the substrate at a fixed distance from the substrate surface. Extrusion dies are fabricated from various types of steel alloys since these materials offer the following properties which are generally required for the dies: dimensional stability, high hardness, machinability, capability of achieving a high degree of flatness and surface finish, compatibility with the process polymers, and high temperature capability (in some cases). When using extrusion dies for an application that requires very low levels of contamination, such as the fabrication of microelectronics or flat panel displays, then a corrosion resistant steel alloy (commonly referred to as "Stainless Steel") may be used.

However, for the fabrication of many microelectronic parts and of some flat panel displays, even corrosion resistant alloys are not acceptable, due to general contamination/cleanliness concerns and more particularly to ionic contamination which occurs when the process fluid leaches some of the metal ions out of the steel thereby contaminating the coating fluid passing through the head. A further source of contamination can result from actual removal of material from the extrusion head as a result of mechanical abrasion of the coating fluid motion against the extrusion head surfaces.

For these special applications and perhaps others, it is desirable to have a material and fabrication process that will have the mechanical properties required for extrusion dies but without metallic components that contact the process material.

When using metal extrusion heads, prior art mechanisms, such as shown and described in the incorporated patent application Ser. No. 09/148,463, have typically used metal shims to accurately space or separate parts of a dispensing or extrusion head in order to create an extrusion slot and thereby achieve desired flow characteristics. A preferred metal for the shim has been stainless steel. A problem with this approach is that the shim is typically made of different metal than the metal parts being separated, and a galvanic potential is generated between the main metal components and the shim. The combination of this galvanic potential in the presence of fluid flow results in corrosion which can worsen the emission of contaminants into dispensed fluid. In this case, the dispensed fluid could carry those contaminants arising from reaction between the fluid and the metal surfaces, those arising from abrasion or mechanical removal of material by the fluid, those arising from leaching of alloy material from the metal surfaces into the fluid, and finally, those resulting from the galvanic induced chemical reaction between the extrusion head metal and the shim. Further, certain process fluids contain chlorine which may induce corrosion between the fluid and a stainless steel shim, particularly at the interface between the head and the shim.

Therefore, where metal extrusion heads and/or chlorine-containing coating fluids are used, there is a need for a shim which will avoid the problem of galvanic potential induced corrosion and the fluid contamination resulting therefrom, and chemical activity between the shim and the coating fluids.

There is a further need in the art for dispensing and/or extrusion equipment which is sufficiently non-contaminating so as to be usable for coating silicon wafers and flat panel displays.

There is a further need for a non-contaminating extrusion head which is small, light, hard, durable, resistant to warpage, and which can be machined to precise tolerances.

SUMMARY OF THE INVENTION

These and other objects, features and technical advantages are achieved by a system and method which employs ceramic or other non-metallic material to construct an extrusion or dispensing head thereby stopping the emission of contaminants into the fluid being extruded.

Alternatively, the emission of contaminants can be reduced through the use of ceramic or other non-metallic shim material to separate metal parts of an extrusion or dispensing head thereby eliminating the problem of galvanic potential between the shim and the metal parts, the resulting corrosion, and the component of fluid contamination arising from such corrosion.

The use of a ceramic or other carefully selected non-metal material for extrusion head construction usually solves the problem of contaminant emission into the extrusion fluid flow. The non-contaminating character of a non-metallic extrusion head in turn makes extrusion heads acceptable for use in coating parts intended for use in the microelectronics industry such as silicon wafers, as well as for flat panel displays for use in various forms of electronic displays. The use of extrusion heads with their attendant dimensional precision and ability to control fluid flow addresses the problems associated with spin coating of parts for microelectronic applications.

Therefore, the construction of a non-metallic, and non-contaminating extrusion head with the precision attendant to such extrusion heads, makes extrusion coating acceptable for a new range of parts, including those for use in microelectronics applications such as silicon wafers, and certain flat panel displays. The combination of non-contamination and precision permits the non-metallic extrusion head to solve problems associated with the materials used in prior art extrusion head design and with the dispensing properties of prior art spin coating methods.

The material properties desired for the non-metallic extrusion head construction material include rigidity, stability, high hardness which leads to greater smoothness, durability (resistance to wear), toughness (impact resistance), and suitability for mechanical repairs in case of damage such as chipping. Some trade-offs in the area of material properties may be necessary as increasing hardness, which is desirable, is typically accompanied by increasing brittleness, which is undesirable. The stated properties contribute to creating a durable, small, and light extrusion head capable of providing precise fluid flow which is uniform along the length of an extrusion head. Alternatively, since the flow is controllable, different flow patterns are possible such as gradient flow wherein fluid flows more rapidly with increasing proximity to the center of the extrusion head, for example.

It is desirable that the material be as chemically non-reactive as possible and as non-ionic as possible to prevent chemical or ionic reactions between the extrusion head material and the coating fluid. Resistance to abrasion is also desirable to prevent material from the extrusion head from being transferred into the coating fluid by the abrasive effects of fluid flow. In addition to the extrusion head itself being composed of non-metallic material, it is desirable that the entire flow path for the coating fluid be non-metallic.

In an alternative embodiment, the extrusion head would continue to be made of metal, but a shim made of ceramic or other non-metallic material would separate two fabricated metal parts to form an extrusion slot. The objective of the shim design, both in terms of material composition and geometry, as with the non-metallic extrusion head is to achieve precise and consistent fluid flow with a minimum of contamination. The non-metallic shim reduces contamination by stopping contamination due to corrosion between the shim and the metal of the extrusion head.

Shims can also be used with non-metallic heads and are preferably made of a non-metallic material. In the case of a non-metallic head, the issue of galvanic potential induced corrosion is absent, but the use of a non-metallic shim helps prevent contamination in the same way that the rest of the fluid contacting portions of the non-metallic head do.

With regard to fluid flow, a preferred embodiment shim comprises cut out areas creating an opening larger in its cross-sectional dimension than the fluid manifold area of the extrusion head. It has been found that such a cut out helps provide more uniform fluid flow along the length of a shimmed extrusion head.

Therefore, it is a technical advantage of the present invention that extrusion equipment can be made sufficiently non-contaminating to be usable for coating parts intended for microelectronics applications and for flat panel displays.

It is a further technical advantage of the present invention that a non-contaminating extrusion head can be constructed so as to be small, light, hard, durable, be resistant to warpage and which can be machined to precise tolerances.

It is a still further advantage of the present invention that a ceramic extrusion head of a particular stiffness and rigidity can be constructed so as to be shorter, thinner, and lighter than a steel extrusion head of the same stiffness and rigidity.

It is a still further advantage of the present invention that with a small non-metallic extrusion head, only a small amount of fluid is needed to fill the extrusion head, thereby reducing the amount of fluid which needs to be pumped into the head to achieve a steady state fluid status before extrusion begins.

It is a still further technical advantage of the present invention that a non-metallic shim can be used to separate metal parts of an extrusion head thereby preventing corrosion induced by galvanic potential, and fluid contamination resulting therefrom.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWING

For a more complete understanding of the present invention, and the advantages thereof, reference is now made to the following descriptions taken in conjunction with the accompanying drawing, in which:

FIG. 11A depicts an isometric view of a one piece non-metal extrusion head having a metal enclosure according to a preferred embodiment of the present invention;

FIG. 11B depicts a top view of a one piece non-metal extrusion head having a metal enclosure according to a preferred embodiment of the present invention;

FIG. 11C depicts a side view of a one piece non-metal extrusion head having a metal enclosure according to a preferred embodiment of the present invention;

FIG. 11D depicts a section view of a one piece non-metal extrusion head having a metal enclosure according to a preferred embodiment of the present invention;

FIG. 11E depicts an enlarged section view of the extrusion slot of a one piece non-metal extrusion head according to a preferred embodiment of the present invention; and FIG. 12 depicts a section view of a portion an extrusion head, having both wetting and non-wetting surfaces, extruding fluid onto a substrate.

DETAILED DESCRIPTION

FIGS. 1, 2, 3, and 4 depict specific geometries of preferred embodiment parts usable in the construction of a non-metallic extrusion head. Although the parts displayed embody a preferred design when combined to form the extrusion head, the invention is not limited to the specific geometries displayed.

Figure 2A:
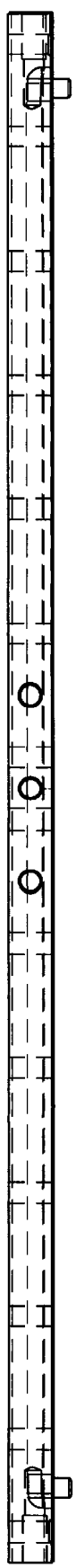
FIG. 2A depicts a top view of head cavity plate for a non-metallic extrusion head according to a preferred embodiment of the present invention.
Figure 2B:
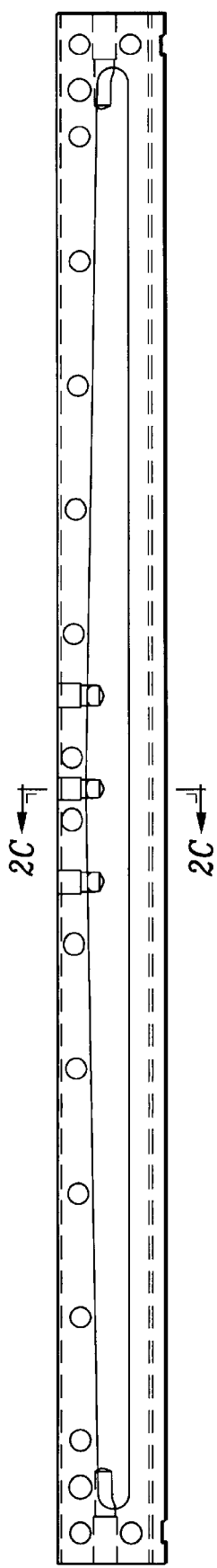
FIG. 2B depicts a side view of head cavity plate for a non-metallic extrusion head according to a preferred embodiment of the present invention.
Figure 2C:
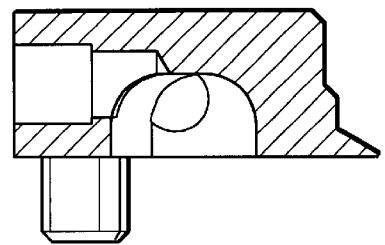
FIG. 2C depicts a section view of head cavity plate for a non-metallic extrusion head according to a preferred embodiment of the present invention.
Figure 3A:
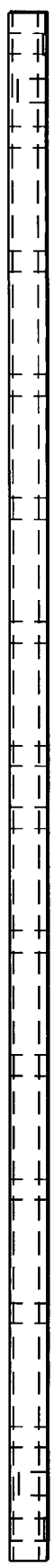
FIG. 3A depicts a top view of an impedance plate for use in a non-metallic extrusion head according to a preferred embodiment of the present invention.
Figure 3B:
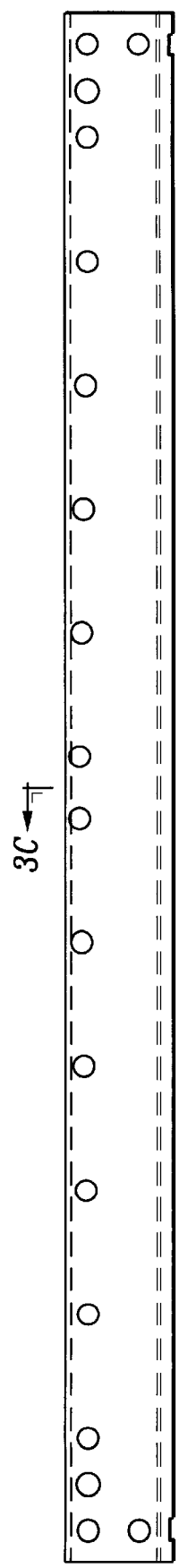
FIG. 3B depicts a side view of an impedance plate for use in a non-metallic extrusion head according to a preferred embodiment of the present invention.
Figure 3C:
FIG. 3C depicts a section view of an impedance plate for use in a non-metallic extrusion head according to a preferred embodiment of the present invention.

FIGS. 2A, 2B, and 2C depict a head cavity plate for a non-metallic extrusion head according to a preferred embodiment of the present invention. The head cavity plate in FIGS. 2A, 2B, and 2C is designed to provide for uniform fluid flow across the length of the opening at the bottom of the extrusion head once assembled to another plate to form an extrusion head. Preferably the plate to which the head cavity plate of FIGS. 2A, 2B, and 2C is attached, is an impedance plate as is depicted in FIGS. 3A, 3B, and 3C. Alternatively, a range of other attachment plates which provide an appropriate fluid seal could be employed. A shim, preferably such as that shown in FIG. 4, would be used to space apart the head cavity plate and the impedance plate or other attachment plate.

Figure 1A:
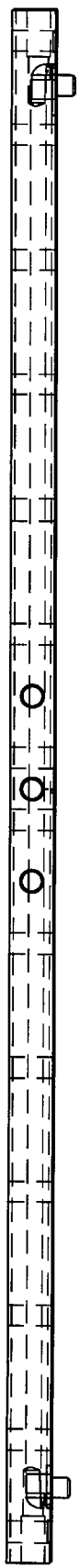
FIG. 1A depicts a top view of a head cavity plate for a non-metallic extrusion head adapted to permit gradient flow according to a preferred embodiment of the present invention.
Figure 1B:
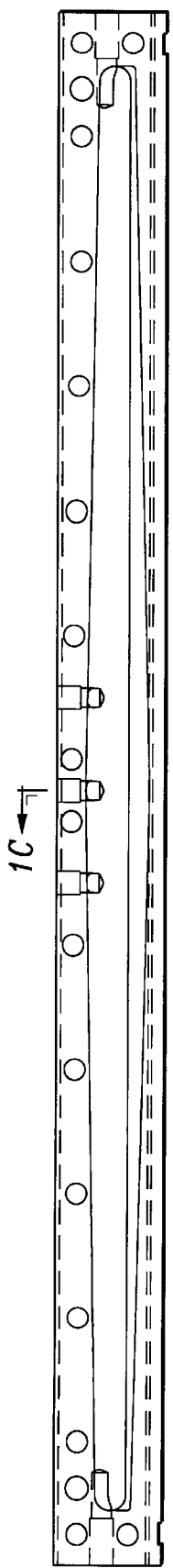
FIG. 1B depicts a side view of a head cavity plate for a non-metallic extrusion head adapted to permit gradient flow according to a preferred embodiment of the present invention.
Figure 1C:
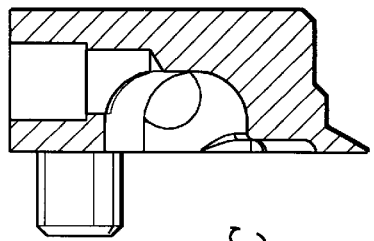
FIG. 1C depicts a section view of a head cavity plate for a non-metallic extrusion head adapted to permit gradient flow according to a preferred embodiment of the present invention.

FIGS. 1A, 1B and 1C depict a head cavity plate for a non-metallic extrusion head adapted to permit gradient flow according to a preferred embodiment of the present invention. In FIG. 1, there is a modification to the interior manifold of the plate which provides for gradient flow. Gradient flow refers to an controlled variation in flow along the length of the extrusion slot within the extrusion head. One commonly selected flow pattern comprises an increased level of coating fluid flow toward the center of the extrusion head opening.

A preferred mechanism for accomplishing gradient fluid flow involves implementation by an internal secondary fluid reservoir or slot symmetrically tapered from both ends thereby minimizing fluid flow impedance at the center of the extrusion head, resulting in higher fluid flow rates at the center point of an extrusion slot than at the ends of said slot.

Constructing an entire extrusion head of the preferred embodiment includes attaching the head cavity plate of FIG. 1 with another plate, preferably an impedance plate as is shown in FIGS. 3A, 3B, and 3C. Alternatively, a range of other attachment plates which provide an appropriate fluid seal could be employed. A shim, preferably such as that shown in FIG. 4, would be used to space apart the head cavity plate and the impedance plate or other attachment plate.

In a preferred embodiment of the present invention, all fluid contacting parts of the extrusion head, and preferably of the entire coating fluid flow path are non-metallic. Preferably, the components which are non-metallic and non-contaminating include a fluid reservoir in which the fluid is initially found, any tubing or piping leading out of said reservoir, fluid contacting components of a pump, fluid delivery equipment leading from the pump to the extrusion head, and the extrusion head itself Further, there is preferably no contact of any metal surface with the coating fluid in between extrusion from the head and deposition onto a substrate. The coating fluid should thereby enjoy a contamination free environment from initial storage in a reservoir up to and including deposition onto a substrate to be coated.

The following materials have been found to provide characteristics desirable for the construction of a non-contaminating extrusion head, and possibly other portions of the flow path from a reservoir to a substrate to be coated, but the invention is not limited to the materials listed below.

The extrusion head construction material preferably comprises Alumina (preferably 99.5% ceramic), other ceramic, quartz (fused silica), MACOR™(available from Corning Inc., Corning, N.Y.), glass with low soda (which is soda lime glass with most of the soda removed), Zirconium impregnated ceramic, or high performance polymer such as glass loaded TEFLON™, RULON™(available from Furon Products of Bristol, R.I.), or others. MACOR™ presents the advantage of being a machinable ceramic. Other materials can of course be used without departing from the inventive concept of the invention. It appears that 99.5% grade Alumina ($Al_2O_3$) or Zirconium impregnated ceramic may best serve the requirements of the microelectronics industry.

The material properties desired for the non-metallic extrusion head and expected of the materials listed above, include rigidity, stability, high hardness which leads to greater surface smoothness, durability (resistance to wear), impact resistance, and suitability for mechanical repairs in case of damage such as chipping. Some trade-offs in the area of material properties may be necessary as increasing hardness, which is desirable, is typically accompanied by increasing brittleness, which is undesirable. The stated properties contribute to creating a durable, small, and light extrusion head capable of providing precise and consistent fluid flow along the length of an extrusion head. More specifically, an extrusion head of a particular length and rigidity can be implemented in a thinner and lighter package using ceramic than when using steel. The ceramic extrusion head may be used along with one or more preferably non-metallic shims to create an orifice of the desired dimensions.

Ceramic dies are preferably fabricated by pressing the base ceramic powder to the general shape of the head, which is deliberately larger than the desired final dimensions of the head to allow for shrinkage, and then firing the ceramic. The ceramic part is then ground and lapped to the final desired dimensions.

A preferred method for lapping parts which will be used to make the extrusion die or extrusion head involves the use of a rotating lapping table which is preferably made of lead or cast iron. Preferably, a coating of gritted paste is applied to the surface of this lapping table which when moved against the surface of a ceramic part or other material acts to remove fine amounts of material permitting accurate control of the dimensions of the part being lapped. Preferably, a fixture holds the part being lapped in place above the lapping table and acts to apply a moderate and preferably adjustable level of pressure on the lapped part in the direction of the lapping table. Lapping is a way of fine tuning a machining process. The lapping material may be paste, paper, or fine abrasive material.

Alternatively, lapping may be done by hand. Lapping may be performed by itself, or be performed on a part after one or more other machining operations.

It is desirable that the extrusion die or extrusion head material be as chemically non-reactive as possible and as non-ionic as possible to prevent chemical or ionic reactions between the extrusion head material and the coating fluid. Resistance to abrasion is also desirable to prevent material from the extrusion head from being transferred into the coating fluid by the frictional effects of fluid flow.

The stated objectives of preventing chemical, ionic, and abrasion-caused material contamination of the coating fluid are further enhanced by having the entire coating fluid flow path be composed of non-metallic material along with the extrusion head, and for the fluid flow path to similarly resistant to chemical, ionic, and abrasion-caused material contamination of the coating fluid.

A number of different types of extrusion flow are possible based on the extrusion head design. A non-exclusive list of such designs includes: gradient flow, uniform flow, multiple fluid paths within a single die, multiple extrusion orifices within a single extrusion head, multiple heads within a single assembly, variable width extrusion die, and an extrusion die with flexible lips.

Figure 4:
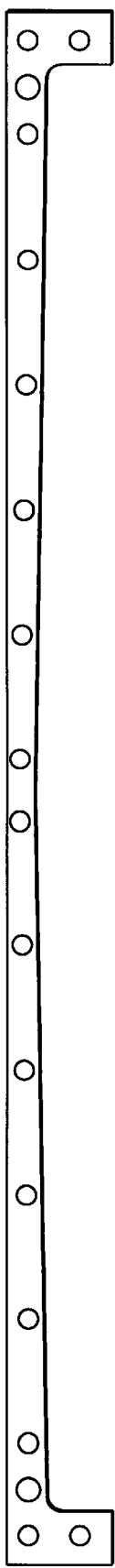
FIG. 4 depicts a non-metallic shim for use in a metallic extrusion head according to a preferred embodiment of the present invention.

FIG. 4 depicts a non-metallic shim for use in an extrusion head according to an alternative preferred embodiment of the present invention. The shim depicted in FIG. 4 may be used with either a metallic or non-metallic extrusion head. The dimensions and specific shape of the shim depicted in FIG. 4 represent one preferred embodiment shim, but the invention is by no means restricted to the specific shape shown.

In an alternative preferred embodiment of the present invention, contamination reduction is achieved not by constructing the entire extrusion head out of non-metallic material, but instead by deploying a non-metallic shim to properly space or separate fabricated metal parts which the extrusion head is made of Use of such a non-metallic shim prevents corrosion due to the generation of galvanic potential which frequently exists between extrusion head material and metal shims. Prevention of such corrosion also prevents contamination of the coating fluid with the chemical products of such corrosion.

In an alternative embodiment of a non-contaminating shim, a metal shim component could be coated with non-metallic material which would be bonded or laminated to the metal shim core. It would of course be necessary for the coating to be thick enough and resilient enough to reliably insulate the metal shim interior from contact with either the extrusion head material or the coating fluid.

Desired properties for the shim or shim coating covering a metal interior include resistance to compression, durability, dimensional consistency and resistance to chemical and ionic activity with both the coating material and the extrusion head material.

Some preferred non-metallic materials for achieving the stated properties include, but are not limited to KAPTON™ (available from E.I. DuPont De Nemours and Company) which is a cured polyimide film, MYLART™ (available from E.I. DuPont De Nemours and Company), pressed ceramic paper, polymer, thin glass sheet, and TEFLON™. Using non-metallic shims presents the advantages of: eliminating the galvanic potential between the shim and the head, and thus the contamination resulting from emission of corrosion materials into the coating fluid, providing a better seal to reduce the amount of coating fluid which can migrate between the shim and the head thereby initiating corrosion, and providing a better seal between the shim and head.

Further benefits can be obtained by applying a TEFLON™ or other non-metallic coating to metal portions of the extrusion head which will contact the shim. The application of TEFLON™ improves the seal between the head and the shim, and further reduces the likelihood of corrosion in the event that coating material gets trapped between the shim and the head.

The above mentioned embodiments of extrusion heads can be employed with a range of extrusion cross-sectional geometries and relative motion arrangements between the extrusion head and the surface to be coated. Although mention has been made of a rectangular slot cross-sectional extrusion geometry, the invention is not limited to that embodiment. The cross-sectional geometry of the extrusion orifice may be square, triangular, or in the shape of any polygon with either straight or curved line segments, or oval, circular, or any curved shape. There may also be multiple extrusion slots within a single extrusion head.

The current invention may be practiced with a variety of relative motion arrangements between the extrusion head and a substrate (the part to be coated). The possibilities for accomplishing the desired relative motion include, but are not limited to rotation of the substrate under an extrusion head which may be linearly or rotationally mobile, substantially linear motion of the substrate under a mostly stationary extrusion head, or substantially linear motion of an extrusion head over a mostly stationary substrate.

Figure 5B:
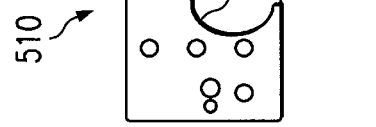
FIG. 5B depicts a shim according to an alternative preferred embodiment of the present invention.
Figure 5A:
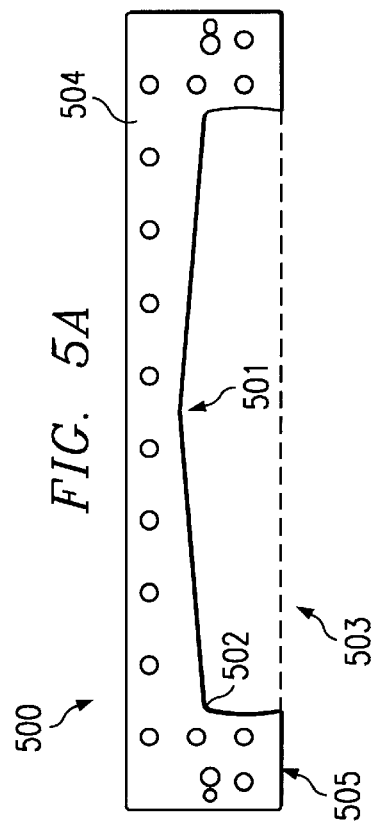
FIG. 5A depicts a shim according to a preferred embodiment of the present invention.

FIG. 5A depicts an elevation view of a shim according to a preferred embodiment of the present invention. The shim 500 is shown such that the flow of fluid is towards an opening in the shim 503 which corresponds with the location of the extrusion head orifice. The solid material of the shim 504 which acts to separate parts of the extrusion head, has a contour 501 marking the boundary between the shim material and open space in between the parts of the extrusion head. Within the contour 501 is a corner 502 below which the shim material continues in a substantially straight line towards the bottom edge 505 of the shim 500. This bottom edge 505 is closely aligned with the bottom edge of the extrusion head parts on either side of the shim 500.

A problem associated with the shim of FIG. 5A is that the nature of the contour 501 in the area of the corner 502 as well as the straight portion beneath this corner acts to restrict fluid flow near the edges of the opening or orifice 503 causing fluid flow to be higher in the center of the opening 503 than at either side contrary to the intent of a particular extrusion head design. It is often desirable to have the flow be consistent along the length of the extrusion head orifice and correspondingly of the shim opening 503.

FIG. 5B depicts a shim 510 according to a preferred embodiment of the present invention. This embodiment shim 510 also has a contour 511 and an opening 513 corresponding to the location of the extrusion head orifice. In this embodiment however, the shape of the contour 511 leading to the opening 513 comprises an indentation or cut-out area 512 rather than a relatively sharp corner followed by a straight line leading to the opening 503, as was the case in FIG. 5A. This indentation prevents inhibition of fluid flow near the edges of the opening 513 and thereby aids in ensuring uniform fluid flow across the length of the shim opening 513.

The contour 511 shape shown in FIG. 5B illustrates the benefits of providing an indentation as described for making fluid flow more uniform, but the invention is not limited to the precise shape shown in FIG. 5B. The ideal shape of the contour 511 for the purposes of accomplishing uniform fluid flow at the opening 513 will vary based on fluid properties including but not limited to viscosity, solvent base, percent solids content, and process conditions including but not limited to flow rate, pressure, shim thickness, and distance between the extrusion head and substrate.

Figure 6:
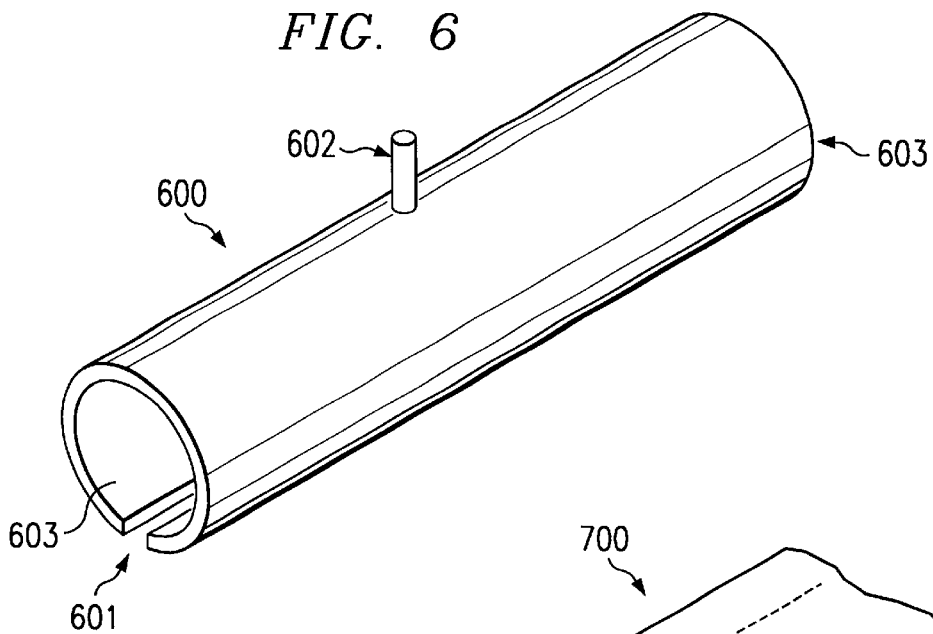
FIG. 6 depicts an isometric view of a one piece extrusion head according to an alternative preferred embodiment of the present invention.

FIG. 6 depicts an isometric view of a one piece extrusion head 600 according to an alternative embodiment of the present invention. The extrusion head preferably has a tubular shape with a slot 601 at the bottom serving as an extrusion orifice for coating fluid. Alternatively, the head 600 need not have a circular cross-sectional area, but may have one of any number of cross-sectional shapes including but not limited to a square, oval, rectangle, or triangle. The head 600 is not limited to having a single dimensionally consistent opening from one end of the head 600 to the other, but may in fact have a plurality of openings of varying shapes and sizes distributed along a lower surface of the head 600.

The width of the extrusion slot 601 may simply be the width of the saw blade used to cut the opening in the cylindrical non-metallic structure. Alternatively, the opening may be modified after the opening has been cut by clamping the open ends of the head together in a controlled manner.

Not shown in FIG. 6 are plugs which would be inserted into the ends 603 of the head 600 to prevent coating fluid from exiting from the ends. The plugs would form a fluid-tight seal with the head 600 and could be made a variety of non-metallic materials. The plugs could be secured by friction fit, glue, clips, clamps, or pins. If necessary, matching holes can be drilled in the head 600 and the plugs through which attachment pins can be inserted once the plugs are in place.

The head 600 preferably has a fluid input port 602 for receiving coating fluid into the extrusion head. The input port is preferably of a dimension suitable for handling the full range of fluid flow rates and fluid viscosities to be encountered during operation of the extrusion head 600. In order to accommodate varying flow rates and other fluid characteristics, the input port 602 preferably boasts an opening of adjustable size. Alternatively, the size of the input port may be fixed at a dimension appropriate for the intended use of the extrusion head to which it is attached. The port 602 is preferably located opposite the extrusion slot 601 and substantially equidistant from either end 603 of the head 600.

Alternatively, coating fluid could be received into the extrusion head 600 from one of the ends 603 of the extrusion head, thereby obviating the need for an input port comprising a separate part 602 attached to the head 600.

Preferably, the one piece head is made of a material which acts to reduce contamination released into the coating fluid. Non-metallic substances such as ceramic are preferred for this purpose. Alternatively, stainless steel or a combination of materials may be employed.

FIG. 11A depicts an isometric view 1100 of a one piece non-metal extrusion head 1101 having a metal enclosure 1102 according to a preferred embodiment of the present invention. The embodiment shown depicts an extrusion head 1101 with a substantially circular cross-sectional geometry surrounded by a tubular metal enclosure 1102. The inventive concept is not limited to this geometry however. A variety of cross-sectional geometries may be employed while preserving the single piece internal cavity arrangement including a rectangle, triangle, or any polygon and a circle, oval or any curved shape.

Not shown in FIG. 11 are plugs which would be inserted into the ends of the head 1100 to prevent coating fluid from exiting from the ends as was discussed in connection with the extrusion head of FIG. 6. The plugs would form a fluid-tight seal with the head 100 and could be made a variety of non-metallic materials. The plugs could be secured by friction fit, glue, clips, clamps, or pins. If necessary, matching holes can be drilled in the head 1100 and the plugs through which attachment pins can be inserted once the plugs are in place.

Three inlet/vent holes are shown for conducting coating fluid into and/or out of the extrusion head 1101. Of course, any number of holes may be used. Any individual hole may be used for either receiving fluid into or removing fluid from the extrusion head.

FIG. 11B depicts a top view of a one piece non-metal extrusion head having a metal enclosure 1100 according to a preferred embodiment of the present invention. Element 1100 represents the combination of the non-metal extrusion head 1101 and the metal enclosure 1102. However, the non-metal extrusion head material is not visible in the view of FIG. 11B. The three fluid inlet/vent holes 1103 are shown from above.

FIG. 11C depicts a side view of a one piece non-metal extrusion head having a metal enclosure according to a preferred embodiment of the present invention.

FIG. 11D depicts a section view of a one piece non-metal extrusion head having a metal enclosure according to a preferred embodiment of the present invention. The non-metal cavity 1101 is clearly shown in contact with the metal enclosure 1102.

FIG. 11E depicts an enlarged section view 1110 of the extrusion slot 1111 of a one piece non-metal extrusion head 1101 according to a preferred embodiment of the present invention. Both "sections" visible in FIG. 11E are in fact part of the single piece extrusion head 1101. The width of the slot 1111 in the embodiment of FIG. 11 is determined by the width of the saw blade used to cut the one piece cavity. In an alternative embodiment, the width of the slot could be adjusted through the use of a clamp to adjustably squeeze the slot to various possible dimensions. In another alternative embodiment, the width of the slot could be widened by inserting one or more shims of carefully selected widths in the extrusion slot, preferably at the two ends.

Figure 7:
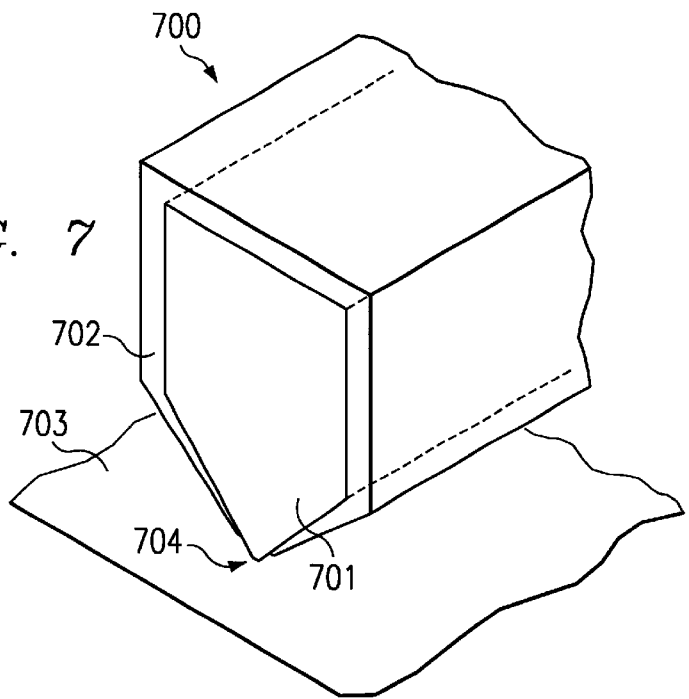
FIG. 7 depicts an isometric view of a an extrusion head reinforced by a secondary structure according to a preferred embodiment of the present invention.

FIG. 7 depicts an isometric view of a an extrusion head 700 reinforced by a secondary structure according to a preferred embodiment of the present invention. Preferably the extrusion head 701 is made of ceramic or other non-metallic material thereby providing the various properties of non-contamination and rigidity within a small footprint previously discussed in connection with such materials. The supporting outer structure 702 is preferably made of steel or other hard rigid metal to protect the extrusion head from damage.

Ceramics and other non-metallic materials, although possessing desirable properties with respect to non-contamination and rigidity within a small footprint, may, in many cases be brittle, and would benefit from a protective outer coating. The outer coating 702 would preferably add rigidity and strength to the overall assembly 700 while being less brittle and generally more impact resistant than the head material. While the preferably metallic outer structure would preferably cover much of the head for the purpose of protection, it is important that the outer structure not contact any coating material either before or after extrusion onto the substrate to be coated 703. Therefore, for some distance on either side of the extrusion slot 704, the extrusion head material would not be covered by the outer structure thereby ensuring that the coating material would contact only the head material 701.

Alternatively, the protective structure need not provide continuous surface coverage of the non-metallic head over the portion covered, but could comprise a skeletal structure, such as a set of beams following the outside contour of the non-metallic head, or a protective ring of metal located primarily near the extrusion orifice to prevent chipping in that region. A variety of geometries of the protective structure may be practiced without departing from the inventive concept described herein.

In a preferred embodiment, a compliant material layer such as neoprene, rubber, or urethane is disposed between the metal protective structure and the non-metallic extrusion head to absorb a portion of any impact imparted to the external structure. Such a layer would prevent the non-metallic head from experiencing the full force of any impact on the external supporting structure thereby affording further protection.

In an alternative embodiment, the head material 701 could be made of a highly corrosion resistant metal and the outer material 702 made of any structurally rigid and impact resistant material.

There is a substantial range available with respect to the proportion of the overall structure 700 which is composed of the preferably metallic outer structure 702 and the preferably non-metallic inner portion or head 701. In an embodiment at a first end of the spectrum, a thin preferably metal outer structure protects a mostly non-metallic head or inner structure. At the opposite end of the spectrum, the head is in fact mostly metallic and has an inner lining or coating of ceramic or other non-metal material of which all fluid contacting surfaces are composed. Obviously, there exists a wide range variations of relative thicknesses of the outer preferably metal coating and the inner preferably non-metallic material which can be readily deployed without departing from scope of the inventive concept presented.

Figure 8:
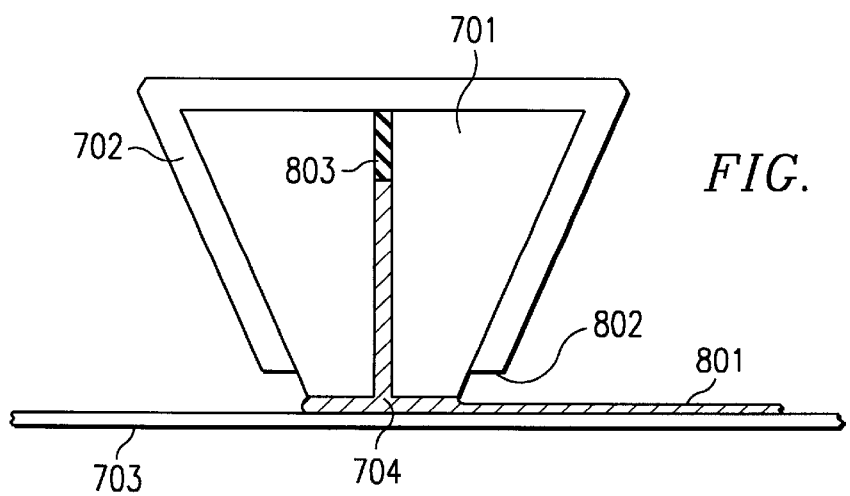
FIG. 8 depicts an section view of an extrusion head supported by a secondary structure while extruding coating fluid according a preferred embodiment of the present invention.

FIG. 8 depicts an section view of an extrusion head 701 supported by a secondary structure while extruding coating fluid 801 from the extrusion slot 704. The outer structure 702 is in contact with the extrusion head material 701. This view portrays the same basic device as does FIG. 7. The relative position of the coating fluid 801, including that which has already been deposited on the substrate 703 and that which is currently being extruded, with respect to the lower edge 802 of the outer structure 702, is preferably maintained with a safe margin so that the outer structure 702 never contacts the coating fluid 801. Preventing contact between the outer structure 702 and the fluid 801 is desirable because the outer structure is preferably made of metal, and allowing contact between such a metal structure and the coating fluid could cause contamination of the fluid and thereby defeat the purpose of having a non-metallic extrusion head. Knowledge of the parameters of the coating operation, the thickness of the coating to be deposited, and the properties of the fluid, including viscosity and surface tension, will assist in determining where the lower edge 802 of the outer surface 702 should be located.

The two portions of the extrusion head 701 in the view of FIG. 8 are preferably separated employing a non-metallic shim (not shown) of appropriate thickness. The parts of the head 701 can be held together by the outer structure 702, or by bolts, clips, clamps, or pins.

Figure 9A:
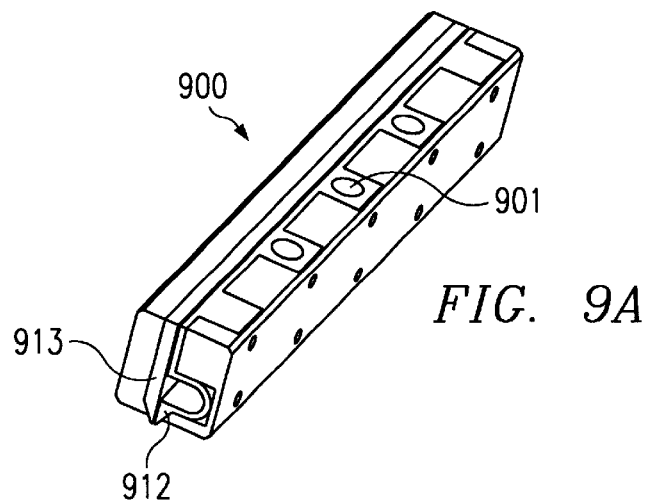
FIG. 9A depicts an isometric view of an extrusion head comprising non-metal fluid contacting inserts according to a preferred embodiment of the present invention.

FIG. 9A depicts an isometric view of an extrusion head 900 comprising non-metal fluid contacting inserts according to a preferred embodiment of the present invention. The embodiment shown represents one mechanism for extruding fluid using an extrusion head in which all fluid contacting parts are non-metallic, but the remaining parts of the head may be metallic. Fluid inlet/vent holes 901 are shown and are discussed more fully in connection with FIG. 9B. Non-metallic cavity insert 912 and non-metallic impedance insert 913 face each other and are separated by a preferably non-metallic shim (not shown) thereby forming a fluid flow path to the extrusion slot 915. The cavity insert 912 and impedance insert are more clearly visible in FIG. 9D.

The embodiment shown has a substantially rectangular shape when viewed along the side or the top. However, the inventive head design is not limited to this or any particular shape.

Not shown in FIG. 9A are plugs which would be inserted into the ends of the head 900 to prevent coating fluid from exiting from the ends. The plugs would form a fluid-tight seal with the head 900 and could be made a variety of non-metallic materials. The plugs could be secured by friction fit, glue, clips, clamps, or pins. If necessary, matching holes can be drilled in the head 900 and the plugs through which attachment pins can be inserted once the plugs are in place.

Figure 9B:
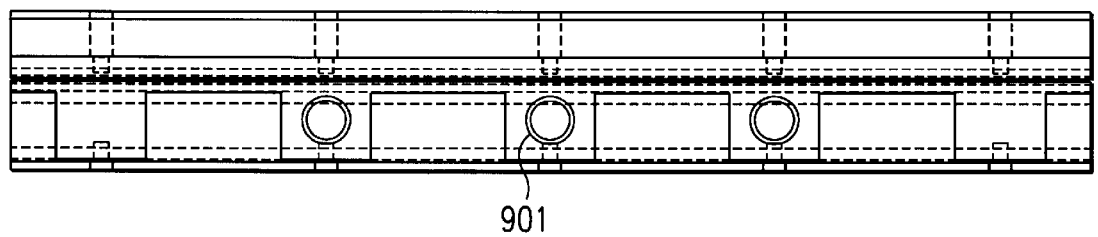
FIG. 9B depicts a top view of an extrusion head having non-metal fluid contacting inserts according to a preferred embodiment of the present invention.

FIG. 9B depicts a top view of an extrusion head 900 having non-metal fluid contacting inserts according to a preferred embodiment of the present invention. Three fluid inlet/vent holes 901 are shown. Alternatively, any number of holes could be employed. Any individual hole 901 could be directed toward receiving fluid into the extrusion head 900, venting fluid out of the head, or be plugged, depending upon the needs of the application. Preferably, at least one of the holes 901 would have to be used to receive fluid into the extrusion head 900.

Figure 9C:
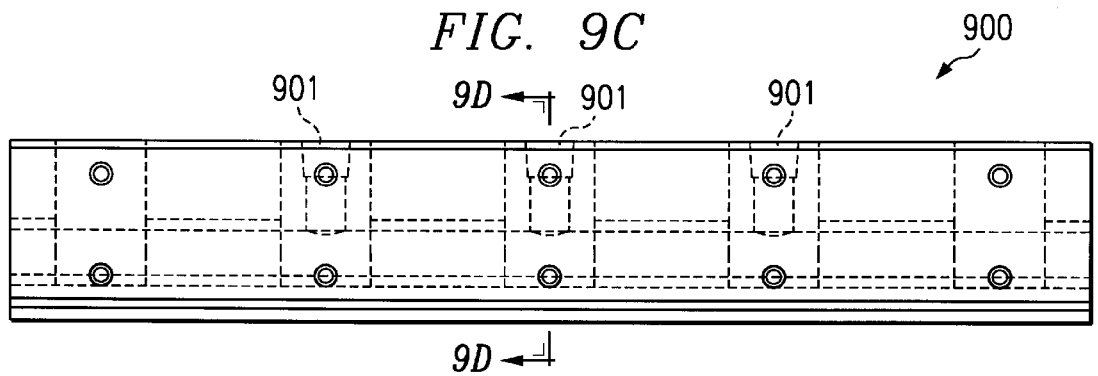
FIG. 9C depicts a side view of an extrusion head having non-metal inserts according to a preferred embodiment of the present invention.

FIG. 9C depicts a side view of an extrusion head 900 having non-metal inserts according to a preferred embodiment of the present invention.

Figure 9D:
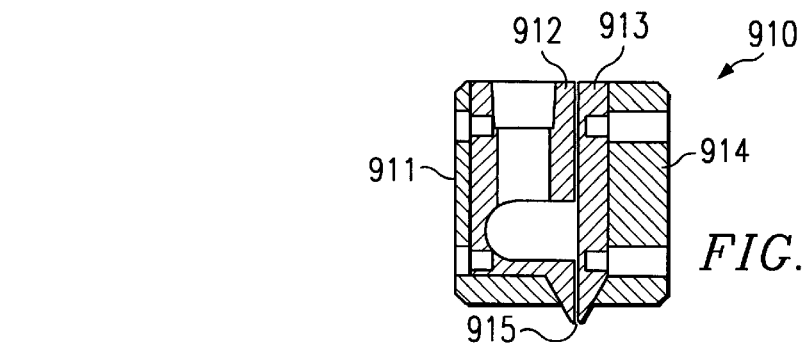
FIG. 9D depicts a section view of an extrusion head having non-metal inserts according to a preferred embodiment of the present invention.

FIG. 9D depicts a section view 910 of an extrusion head 900 having non-metal inserts according to a preferred embodiment of the present invention. A metal cavity plate 911 supports a non-metallic cavity insert 912. Thus, the non-metallic cavity insert contacts the fluid thereby minimizing contamination while the preferably metallic cavity plate 911 provides structural support and impact resistance. In a similar manner, a preferably metallic outer impedance cover plate 914 runs alongside a non metal impedance insert 913. Again, the non-metallic impedance insert 913 contacts the fluid to minimize contamination, while the impedance cover plate 914 provides structural support and impact resistance. By employing a combination of metal and non-metal parts, this embodiment benefits from the structural and protective characteristics of steel or other metal while still minimizing contamination by preventing any metal to fluid contact. Fluid can thereby emerge from extrusion slot 915 without having contacted any metal while inside the extrusion head.

In an alternative embodiment, the cavity plate 911 and cover plate 914 could be made of a structurally rigid and impact resistance material which is non-metallic.

Figure 10A:
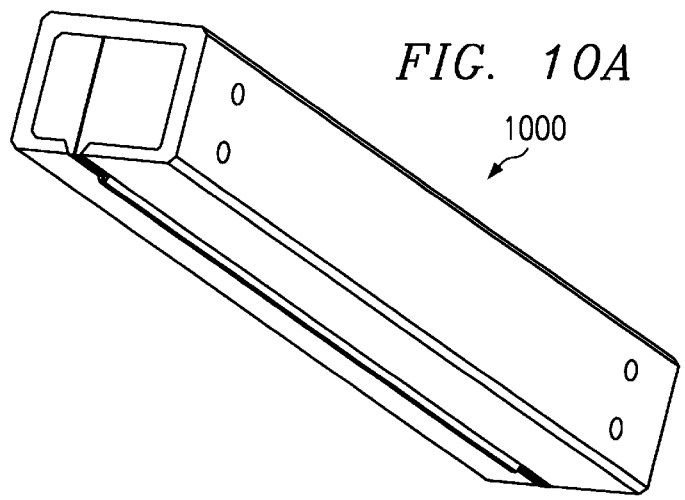
FIG. 10A depicts an isometric view of a non-metal extrusion head according to a preferred embodiment of the present invention.

FIG. 10A depicts an isometric view of a non-metal extrusion head 1000 according to a preferred embodiment of the present invention. In this case, the entire extrusion head is made of non metallic materials.

Figure 10B:
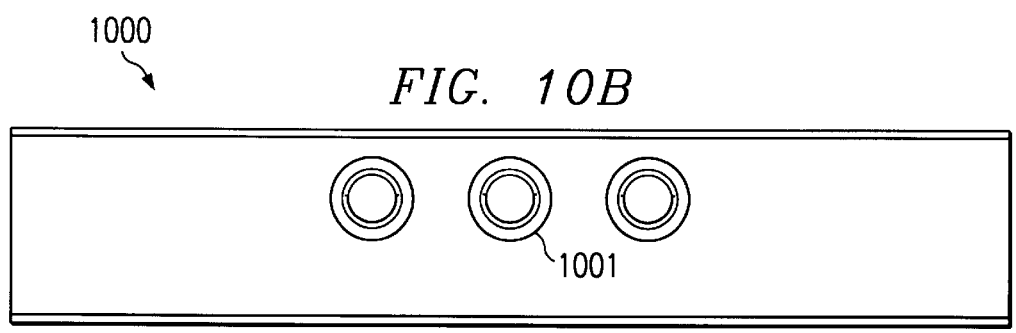
FIG. 10B depicts a top view of a non-metal extrusion head according to a preferred embodiment of the present invention.

FIG. 10B depicts a top view of a non-metal extrusion head 1000 according to a preferred embodiment of the present invention. Three inlet/vent holes 1001 are shown. Alternatively, any number of holes could be employed. Any individual hole could be used to either receive fluid into the head 1000 or remove fluid from the head.

Figure 10C:
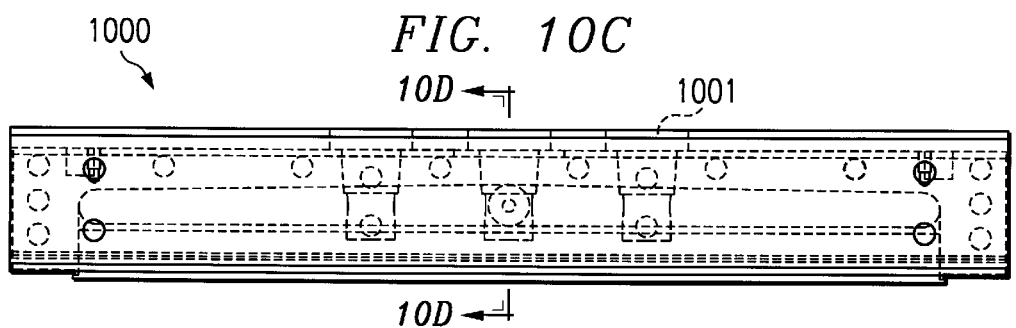
FIG. 10C depicts a side view of a non-metal extrusion head according to a preferred embodiment of the present invention.

FIG. 10C depicts a side view of a non-metal extrusion head 1000 according to a preferred embodiment of the present invention. Three fluid holes or ports 1001 are shown.

Figure 10D:
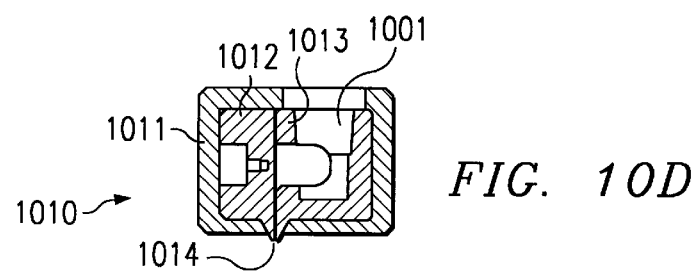
FIG. 10D depicts a section view of a non-metal extrusion head according to a preferred embodiment of the present invention.

FIG. 10D depicts a section view 1010 of a non-metal extrusion head 1000 according to a preferred embodiment of the present invention. A non-metallic die impedance plate 1012 is shown in contact with a non-metallic die cavity plate 1013 surrounded by a non-metallic cover 1011.

Preferably, the non-metallic materials for the die impedance plate 1012 and non-metallic die cavity plate 1013 are selected for their non-contaminating properties, while the material for the cover is selected for properties of rigidity and impact resistance and could include various forms of plastic.

For the extrusion heads depicted in FIGS. 9 and 10, the gaps for the extrusion head slots 915 in FIG. 9, and 1014 in FIG. 10, are set by employing non metallic shims to separate the two fabricated parts. The non-metallic shim is preferably like that depicted in FIG. 4 and discussed in connection therewith.

FIG. 12 depicts an elevation view of a portion of an extrusion head 1201, having both wetting and non-wetting surfaces, extruding fluid onto a substrate 703. The extrusion head 1201 is extruding coating material or fluid 801 onto substrate 703. The extrusion head comprises both wetting surfaces 1202 and non-wetting surfaces 1203. The fluid passages in the extrusion head leading down to the opening at the bottom of the head and the surfaces on the head parallel to the substrate 703 are in contact with the fluid and are wetting surfaces. By contrast, the surfaces on the side of the extrusion head 1201 are non-wetting surfaces 1203. The non-wetting surfaces are located and treated so as to prevent any migration of the coating material 801 up the sides of the extrusion head 1201.

The two parts 1201 of the extrusion head are preferably separated by a non metallic shim 1204, and may be held together by clips, clamps, bolts, or pins.

Restricting the migration of coating material in this manner helps prevent the drying and flaking of coating material which has drifted up the sides of the extrusion head 1201. Flakes resulting from the drying of migrated coating material can fall onto the substrate and ruin a fresh coating of fluid thereon. Inhibiting the drift or migration of coating material also helps prevent any contact between the coating material 801 and a metal cover on the extrusion head if one is present. Contact between the coating fluid and a metal cover can contaminate the fluid making such contact. This contamination could also spread to the main area of fluid deposition at the extrusion slot. The use of coating material is rendered more efficient by restricting the movement of the fluid as fluid which might otherwise migrate up the sides of the head and dry up ends up getting productively used in the coating process instead.

The prevention of fluid migration up the side of the extrusion head is accomplished through the application of special coatings or surface finishes to the surfaces which are designated as "non-wetting".The special coatings and/or surface finishes could be applied to either metal or non-metal extrusion head surfaces.

The materials needed to create non-wetting surfaces could be selectively applied to the desired surfaces. Alternatively, the non-wetting materials could be applied to the entire head, and then selectively removed by performing grinding, lapping, or other operations to the surfaces designated as non-wetting surfaces. The non-wetting materials can be applied to both metal and non-metallic surfaces on either the extrusion head itself or on a support structure surrounding or attached to the head.

In the case of metals, migration of fluid can be prevented through the application of TUFRAM™ or NEDOX™ coatings (both available from General Magnaplate Corporation of Linden, N.J.). TUFRAM™ coatings on metals create fluorocarbon impregnated surfaces which are both oleophobic and hydrophobic, and thereby resist wetting. NEDOX™ surface treatments produce polymer-impregnated surfaces which are also oleophobic and hydrophobic, and thereby also resist wetting.

In the case of ceramic material, a hydrophobic surface treatment is applied to the surface area on the ceramic where coating material drift is to be inhibited. One method of accomplishing the required hydrophobic ceramic surface treatment is available from WESGO Ceramics GmbH, based in Erlangen, Germany.

The present invention is of particular benefit to the design of linear extrusion coating devices as disclosed in patent application Ser. No. 09/148,463. Since ceramic heads for a particular extrusion application can be implemented in a smaller and lighter package than for a metal head, the tight tolerances in the placement of the extrusion head with respect to a substrate to be coated as well as to equipment for moving the extrusion head and substrate with respect to each other benefit from having a smaller and lighter extrusion head assembly.

The smaller dimensions of a ceramic head make priming the head easier. Where flow of fluid from the extrusion head is to be primed by moving the head over a priming surface which mimics the substrate in order to achieve uniform flow before reaching the substrate, a smaller head permits the priming surface to be accessed more easily. Further, the smaller head may permit machinery to be located in closer proximity to the priming surface without disturbing the head as it moves across the priming surface. This should in turn, permit the overall coating assembly to have a smaller footprint as well.

The precision of fluid extrusion also benefits from having the extrusion head implemented in a smaller footprint. The smaller overall size of the extrusion head is accompanied by a correspondingly smaller fluid manifold within the head. This tends to reduce the amount of fluid which must be pumped into the head to bring it to a steady state flow condition enabling more accurate control of fluid extrusion.

Implementation of an extrusion head in a smaller and lighter package using ceramic than for a metal head is of particular benefit to a moving head configuration extrusion assembly such as that disclosed in patent application Ser. No. 90/227,667. The operation of the moving head system is such as to require horizontal and vertical movement of a gantry structure carrying the extrusion head. The lighter the head is, the easier it is for the system to move the gantry with precision to the positions commanded by the control system.

The moving head application of patent application Ser. No. 90/227,667 also comprises an automatic height adjustment system to maintain a constant gap between the extrusion head and the substrate being coated. The height adjustment operates in real time to extremely fine levels of precision. It is therefore beneficial to such a real time adjustment system that the part whose height is adjusted in real time be as light as possible thereby minimizing the load on the motors or other moving means and also minimizing the load on weight bearing structures which may bend to some degree under the weight of the extrusion head, possibly introducing positioning error, and wear and tear on the equipment.

The moving head application comprises a pump on head system for precise control of fluid flow to the extrusion head. The ability to implement an extrusion head in a smaller package utilizing ceramic material and thereby having a smaller fluid manifold within the head presents an advantage to the pump on head arrangement. The smaller manifold permits the pump-on-head assembly to more rapidly fill the manifold before beginning a coating operation, to more effectively stop fluid dispensing upon applying suction to the fluid lines leading to the extrusion head, and in general, to more accurately control fluid flow throughout the coating process.

Although particular means and embodiments have been disclosed to perform certain functions in the foregoing, the specification is intended to cover all means capable of performing the stated functions.

Although the present invention and its advantages have been described in detail, it should be understood that various changes, substitutions and alterations can be made herein without departing from the spirit and scope of the invention as defined by the appended claims.

What is claimed is:

1. A system for extruding coating material onto a substrate using an extrusion head which minimizes emission of contaminants into the coating fluid, the system comprising:
    an extrusion head for extruding said coating fluid onto a surface to be coated, wherein at least one fluid contacting surface of said extrusion head is composed of a non-metallic substance, thereby minimizing metal to coating fluid contact and emission of contaminants into said coating fluid;
    a mechanism for moving the extrusion head substantially linearly with respect to a substrate; and
    non-wetting surfaces near a coating fluid bead formed during fluid deposition to inhibit coating fluid migration along a periphery of the extrusion head.

2. A system for extruding coating material onto a substrate using an extrusion head which minimizes emission of contaminants into the coating fluid, the system comprising:
    an extrusion head for extruding said coating fluid onto a surface to be coated, wherein at least one fluid contacting surface of said extrusion head is composed of a non-metallic substance, thereby minimizing metal to coating fluid contact and emission of contaminants into said coating fluid; and
    a mechanism for moving the extrusion head substantially linearly with respect to a substrate,
    wherein the extrusion head comprises:
        two metal parts forming the structure of said extrusion head; and
        a non-metallic shim disposed between said two metal parts, wherein the non-metallic shim prevents galvanic potential induced corrosion between said metal parts and said shim, thereby minimizing emission of contaminants into said coating fluid.

3. The system of claim 1, wherein all fluid contacting parts in said extrusion head are non-metallic.

4. The system of claim 1, wherein said extrusion head is composed entirely of non-metallic material, thereby further minimizing emission of contaminants into said coating fluid.

5. The system of claim 4, wherein the extrusion head is entirely composed of ceramic material.

6. The system of claim 4, further comprising:
    a metal support structure along an exterior of the extrusion head to provide rigidity and impact resistance;
    wherein said metal support structure is positioned so as not to contact the coating fluid.

7. The system of claim 4, wherein the extrusion head comprises:
    a hollow tube having a length; and
    a slot for extruding coating material running the length of said hollow tube.

8. A system for extruding coating material onto a substrate using an extrusion head which minimizes emission of contaminants into the coating fluid, the system comprising:
    an extrusion head for extruding said coating fluid onto a surface to be coated, wherein at least one fluid contacting surface of said extrusion head is composed of a non-metallic substance, thereby minimizing metal to coating fluid contact and emission of contaminants into said coating fluid;
    a mechanism for moving the extrusion head substantially linearly with respect to a substrate;
    a fluid reservoir;
    a pump connected to said fluid reservoir; and
    fluid delivery means connecting said pump and said fluid reservoir to said extrusion head; wherein all fluid contacting surfaces in said system for extruding are non-metallic, thereby further minimizing emission of contaminants into said coating fluid.

9. A method for extruding coating material onto a substrate using an extrusion head which minimizes emission of contaminants into the coating fluid, the method comprising the steps of:
    minimizing metal to coating fluid contact and emission of contaminants into said coating fluid by deploying a non-metallic substance for at least one fluid contacting surface of said extrusion head;
    extruding coating fluid having minimized contaminants onto said substrate; and
    moving the extrusion head substantially linearly with respect to the substrate.

10. The method of claim 9, comprises the further steps of:
    forming the structure of said extrusion head with two metal parts;
    disposing a non-metallic shim between said two metal parts; and
    preventing galvanic potential induced corrosion between said metal parts through said step of disposing, thereby minimizing emission of contaminants into said coating fluid.

11. The method of claim 9, comprising:
    the further step of constructing the extrusion head exclusively with non-metallic material, thereby further minimizing emission of contaminants into said coating fluid.

12. The method of claim 11, wherein the extrusion head is entirely composed of ceramic.

13. The method of claim 11, further comprising:
    providing rigidity and impact resistance to said extrusion head by deploying a metal support structure along an exterior of the extrusion head; and
    positioning said metal support structure so as not to contact the coating fluid.

14. The method of claim 11, wherein the extrusion head comprises:
    a hollow tube having a length; and
    a slot for extruding coating material running the length of said hollow tube.

15. The method of claim 11, wherein the method for extruding comprises the further steps of:

storing coating fluid for use in said method for extruding in a reservoir;

pumping said coating fluid out of said reservoir;

delivering said coating fluid from said pump to said extrusion head, wherein all fluid contacting surfaces in said method for extruding are non-metallic, thereby further minimizing emission of contaminants into said coating fluid.

16. Apparatus for extruding coating fluid uniformly along the extrusion orifice of an extrusion head while minimizing contaminants, the apparatus comprising:

two fabricated parts forming the structure of the extrusion head;

a non-metallic shim disposed between said fabricated parts, thereby establishing an extrusion orifice between said parts, wherein:

the shim and the parts are dimensionally consistent enabling uniform fluid flow along a length of said extrusion orifice;

the non-metallic material of the shim acts to reduce emission of contaminants into the coating fluid;

said shim has a shape; and the extrusion orifice has edges, and wherein the shim shape comprises:

an opening within a fluid cavity inside the extrusion head exceeding the length of the extrusion orifice, permitting said coating fluid to flow unobstructed near the edges of said extrusion orifice thereby enabling uniform fluid flow along the length of said extrusion orifice.

17. The apparatus of claim 16, wherein:

the fabricated parts are metal; and the non-metallic shim acts to reduce emission of contaminants into said coating fluid by eliminating galvanic potential induced corrosion between said metal fabricated parts and said shim.

18. The apparatus of claim 16, wherein the fabricated parts are non-metallic, thereby further minimizing emission of contaminants into said coating fluid.

19. The apparatus of claim 16, further comprising:

non-wetting surfaces located on said extrusion head near a coating fluid bead formed during fluid deposition to inhibit coating fluid migration along a periphery of the extrusion head, thereby preventing subsequent drying and flaking of coating fluid on said periphery near said coating fluid bead.

20. A system for extruding coating fluid onto a substrate while minimizing contamination of the coating fluid, the system comprising:

an extrusion head comprising ceramic fluid contacting components, thereby minimizing contamination of said fluid arising from contact with said fluid contacting components, said extrusion head having an extrusion slot;

a non-metallic shim contoured to permit a uniform rate of fluid flow at said extrusion slot, and a uniform residence time of said coating fluid in said extrusion head;

an impact resistant outer structure surrounding said extrusion head to protect said head against damage; and hydrophobic surface treatments on selected portions of said outer structure and said non-metallic extrusion head to prevent migration of said coating fluid along a periphery of said extrusion head and, alternatively, of said outer structure, thereby preventing drying and flaking of coating material on said head and, alternatively, on said outer structure.

21. The system of claim 20, wherein the shim is made of polyimide film.

22. The system of claim 20, wherein the outer structure is made of stainless steel.

* * * * *